(12) United States Patent
Xu et al.

(10) Patent No.: US 11,302,671 B2
(45) Date of Patent: Apr. 12, 2022

(54) POWER ENHANCED STACKED CHIP SCALE PACKAGE SOLUTION WITH INTEGRATED DIE ATTACH FILM

(71) Applicant: INTEL CORPORATION, Santa Clara, CA (US)

(72) Inventors: Zhijun Xu, Shanghai (CN); Bin Liu, Shanghai (CN); Yong She, Shanghai (CN); Zhicheng Ding, Shanghai (CN)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/641,221

(22) PCT Filed: Sep. 29, 2017

(86) PCT No.: PCT/CN2017/104496
§ 371 (c)(1),
(2) Date: Feb. 21, 2020

(87) PCT Pub. No.: WO2019/061330
PCT Pub. Date: Apr. 4, 2019

(65) Prior Publication Data
US 2020/0227387 A1 Jul. 16, 2020

(51) Int. Cl.
*H01L 25/065* (2006.01)
*H01L 23/00* (2006.01)
(Continued)

(52) U.S. Cl.
CPC .......... *H01L 25/0657* (2013.01); *H01L 24/73* (2013.01); *H01L 24/92* (2013.01);
(Continued)

(58) Field of Classification Search
CPC .................................................. H01L 25/0657
See application file for complete search history.

(56) References Cited

U.S. PATENT DOCUMENTS

| 7,816,181 B1 | 10/2010 | Bhagath et al. |
| 2009/0014891 A1 | 1/2009 | Chang et al. |
| 2012/0115277 A1* | 5/2012 | Lee .......... H01L 24/92 438/107 |

FOREIGN PATENT DOCUMENTS

WO 2017058422 4/2017

OTHER PUBLICATIONS

International Preliminary Report on Patentability for International Patent Application No. PCT/CN2017/104496, dated Apr. 9, 2020.
(Continued)

*Primary Examiner* — Yu-Hsi Du Sun
(74) *Attorney, Agent, or Firm* — Essential Patents Group, LLP.

(57) ABSTRACT

An apparatus comprising: a die stack comprising at least one die pair, the at least one die pair having a first die over a second die, the first die and the second die both having a first surface and a second surface, the second surface of the first die over the first surface of the second die; and an adhesive film between the first die and the second die of the at least one die pair; wherein the adhesive film comprises an insulating layer and a conductive layer, the insulating layer adhering to the second surface of the first die and the conductive layer adhering to the first surface of the second die.

20 Claims, 8 Drawing Sheets

(51) Int. Cl.
*H01L 25/18* (2006.01)
*H01L 25/00* (2006.01)
(52) U.S. Cl.
CPC .............. *H01L 25/18* (2013.01); *H01L 25/50* (2013.01); *H01L 2224/73265* (2013.01); *H01L 2224/92247* (2013.01); *H01L 2225/0651* (2013.01); *H01L 2225/06562* (2013.01); *H01L 2924/1431* (2013.01); *H01L 2924/1434* (2013.01)

(56) References Cited

OTHER PUBLICATIONS

International Search Report and Written Opinion for PCT Application No. PCT/CN2017/104496, dated Jul. 5, 2018.

\* cited by examiner

POWER ENHANCED STACKED CHIP SCALE PACKAGE SOLUTION WITH INTEGRATED DIE ATTACH FILM

CLAIM OF PRIORITY

This Application is a National Stage Entry of, and claims priority to, PCT Application No. PCT/CN/2017/104496, filed on 29 Sep. 2017 and titled "POWER ENHANCED STACKED CHIP SCALE PACKAGE SOLUTION WITH INTEGRATED DIE ATTACH FILM", which is incorporated by reference in its entirety for all purposes.

BACKGROUND

In current package architectures, power bond pads are located at the edge of the silicon die, increasing wire bonding density. Additionally, power pads compete for space with signal pads along the die edge. Power distribution requires traces routed from power pads located at the die edge to points within the die, increasing trace density.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1A:
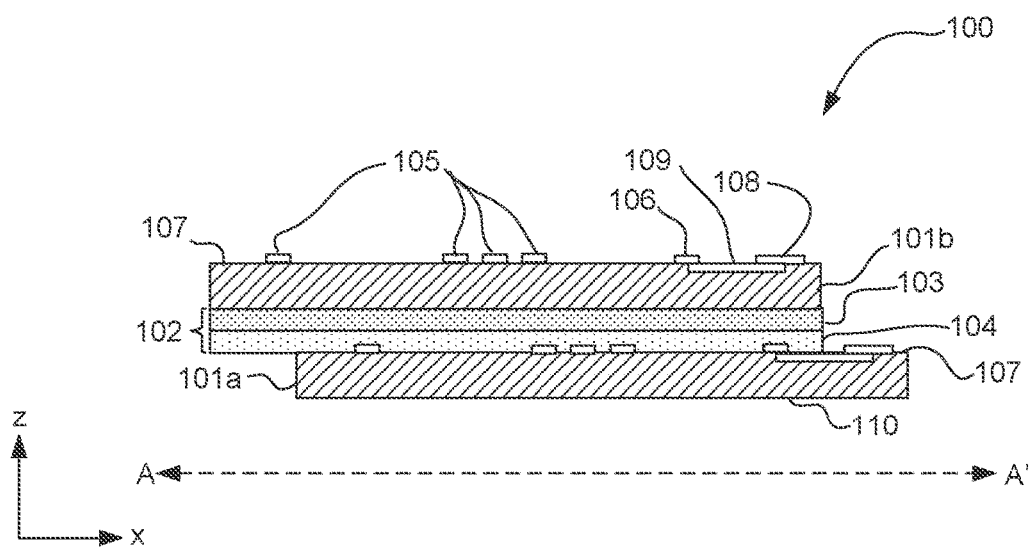
FIG. 1A illustrates a cross-sectional view of a partially complete shingle die stack assembly with a double-layer die attach film (DLDAF) layer between two dies.

A stacked chip scale package (SCSP) architecture is described employing a double-layer conductive die attach film (DAF) having at least one conductive adhesive layer integrated with a non-conducting adhesive layer for attaching dies in a vertical stack. In some embodiments, the insulating layer is sandwiched between two conducting adhesive layers, forming a triple layer conductive DAF. In some SCSP implementation embodiments, the dies in the stack carry bonding pads on a top side. Accordingly, a double-layer conductive DAF is inserted between adjacent dies in a vertical die stack. The conductive layer adheres to the top side of the lower die and forms contacts with bond pads and terminals present on the top side. The insulating layer adheres to the bottom side of the upper die, where no bond pads or terminals are present. In some embodiments, power bond pads and/or terminals are located along the top side of the dies at positions between the bonding edge and the rear edge.

In conventional die architectures, power bond pads are all located at the bonding edge along with signal bond pads. Distributed power terminal layout may provide enhanced power delivery to the integrated circuits carried by the die. The edge-located power bond pads are typically connected to integrated circuits carried on or within the die by internal trace metallization. The architecture of various embodiments provides for greater flexibility of design of integrated circuits carried on or within the die. According to some embodiments, power delivery to the integrated circuits is furnished by external coupling, eliminating reliance on internal trace routing extending from the die edge.

The conductive layer of the double-layer and triple-layer DAF provides a sheet conductor that electrically couples one or more of the distributed power bond pads and/or terminals together. In some embodiments, one or more relay bond pads are located on the top surface near the bonding edge of the die, and in some embodiments, are connected to a wire bonding pad by a short internal trace. According to embodiments, the relay bond pad is externally coupled to the distributed power terminals through the conductive layer of the double-layer DAF. In some embodiments, the relay pad is coupled to a single wire bonding pad on the die edge by a short internal trace. Accordingly, power is delivered to the power terminal pads from the relay pad through the conductive layer. The conductive layer of the double-layer DAF electrically couples the multiple power terminals on the die to a single wire bond pad by the intermediary of the relay pad. Accordingly, wire bonding density at the edge of the die can be significantly decreased, as well as the number of required bond pads located at the bonding edge of the die. According to some embodiments, the conductive layer of the dual-sided DAF is a sheet conductor that is coupled to one or more power terminals on the die surface that is covered by the DAF. In some embodiments, the conductive layer of the DAF has a lower sheet resistance than power trace metallization, thereby providing a low resistance current path from the relay pad to the one or more power terminals through the conductive layer. The low sheet resistance of the conductive layer of the dual-sided DAF allows for lower $I^2R$ power losses that can result in less local heating as well as smaller IR drop.

In some embodiments, the DAF is a triple layer film having an inner insulating layer sandwiched between a first and second outer conductive layers. The insulating layer isolates the first and second outer conductive layers, which form separate conductive adhesive sheets. In some embodiments, a die stack assembly comprises dual-sided dies having integrated circuits on both sides of the die. In this implementation, the triple layer DAF is inserted between upper and lower adjacent dies in the vertical stack, the first conductive layer adhering to the top side of the lower die, and bottom side of the upper die.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

"Bond pad" is a term referring to electrical bond pads in association with test points or external electrical connections of an integrated circuit. Related industry terms are "bond pad" and "bump". "Solder bump" or "bump" is a ball of solder bonded to a bond pad for further assembly of the die into packages by use of surface mount technology, or for wire bonding.

An associated term is "terminal", having the meaning that it is a receiving contact for power or other electrical signals. For the purposes of this disclosure, "terminal" indicates a signal or power sink, and is coupled to a signal or power entry point of an integrated circuit. A terminal may be a bond pad for wire bonding or solder bump attachment.

Throughout the specification, and in the claims, the term "connected" means a direct connection, such as electrical, mechanical, or magnetic connection between the things that are connected, without any intermediary devices. The term "coupled" means a direct or indirect connection, such as a direct electrical, mechanical, or magnetic connection between the things that are connected or an indirect connection, through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The vertical orientation is in the z-direction and it is understood that recitations of "top", "bottom", "above" and "below" refer to relative positions in the z-dimension with the usual meaning. However, it is understood that embodiments are not necessarily limited to the orientations or configurations illustrated in the figures.

The terms "substantially," "close," "approximately," "near," and "about," generally refer to being within +/−10% of a target value (unless specifically specified). Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

Views labeled "cross-sectional", "profile" and "plan" correspond to a orthogonal planes within a cartesian coordinate system. Thus, cross-sectional and profile views are taken in the x-z plane, and plan views are taken in the x-y plane. Typically, profile views in the x-z plane are cross-sectional views. Drawings are labeled with axes to indicate the orientation of the figure.

FIG. 1A illustrates a cross-sectional view in the x-z plane of a shingle die stack assembly 100 with a double layer die attach film between two dies. The section is taken along cut line A-A' in FIG. 1B.

Dies 101a and 101b are vertically stacked in a shingle configuration with edges offset in the x-dimension. In some embodiments, dies 101a and 101b comprise a semiconductor body from which integrated devices are fabricated. In some embodiments, dies 101a and 101b comprise silicon or other group IV elements, such as germanium. In other embodiments, dies 101a and 101b comprise III-V compounds such as InAs, GaAs, InP GaP, GaN, etc. For clarity, two dies 101 are shown in die stack 100. However, die stack 100 may have any number of dies in the stack. Dies 101a and 101b are bonded to one another with double layer conductive die attach film (DLDAF) 102 disposed between dies 101a and 101b. In some embodiments, DLDAF 102 comprises non-conductive adhesive layer 103 over conductive adhesive layer 104. Dies 101a and 101b include one or more power terminal pads 105 and relay pad 106 distributed over top surface 107. According to some embodiments, relay pad 106 is connected internally to wire bond pad 108 by trace 109.

Conductive adhesive layer 104 of DLDAF 102 is disposed over top surface 107 of dies 101a and 101b, (only die 101a is shown as covered), covering power terminal pads 105 and relay pad 106 (shown for die 101b, however, same description holds for die 101a). According to some embodiments, conductive adhesive layer 104 is adhered to top surface 107, and conformally adhering to power terminal pads 105 and relay pad 106. In some embodiments, conductive adhesive layer 104 is a sheet conductor, and electrically couples power terminal pads 105 to relay pad 106. Relay pad 106 is electrically connected to wire bond pad 108, to which power may be delivered by a wire leading from the substrate (not shown) and bonded to wire bond pad 108. In some embodiments, power is distributed to power terminal pads 105 through conductive adhesive layer 104.

In some embodiments, bottom surface 107 of dies 101a and 101b has no metallization for external electrical coupling in the form of contact pads, and is not active electrically. For die attachment, non-conductive adhesive layer 103 of DLDAF 102 is disposed under bottom surface 110 of dies 101a and 101b. In some embodiments, non-conductive adhesive layer 103 is a carrier or backing layer for conductive adhesive layer 104, and adheres to inactive bottom surface 110 of dies 101a and 101b to complete attachment of adjacent dies 101a and 101b. While not active, bottom surface 110 may exhibit conductivity, and must be isolated from the metallization on lower adjacent die by an insulating film. Non-conducting adhesive layer 103 serves this function.

Figure 1B:
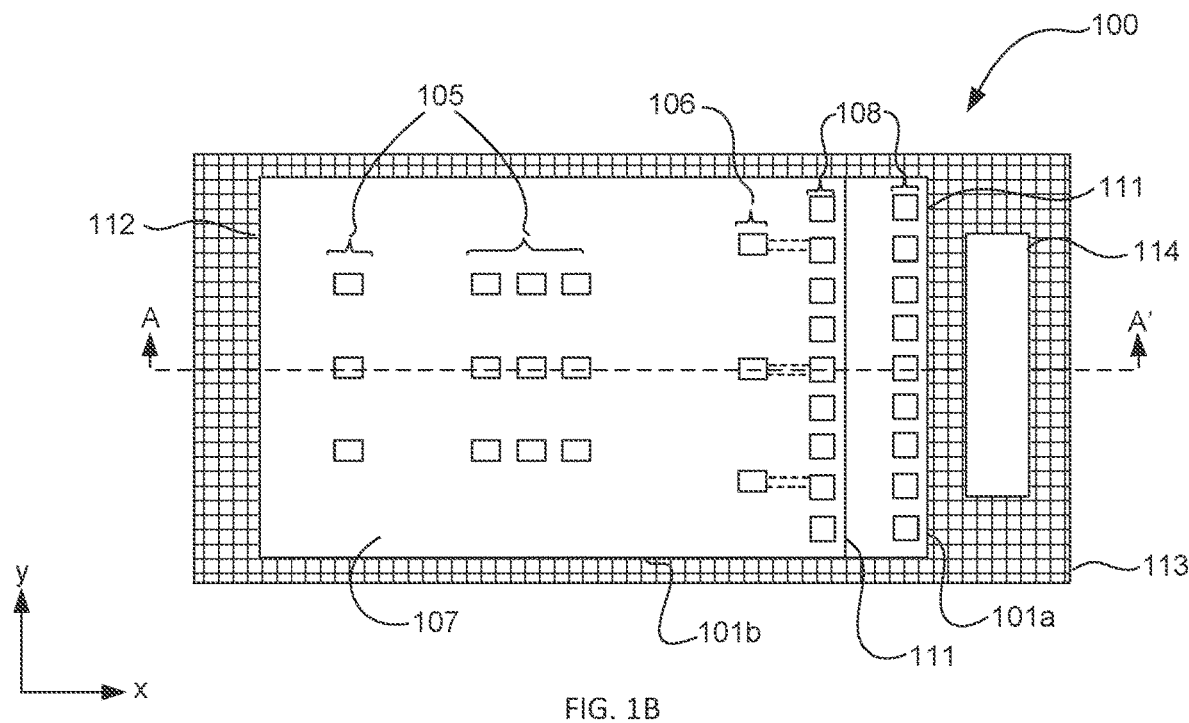
FIG. 1B illustrates a plan view of the shingle die stack of FIG. 1A, showing bond pads distributed on the upper die surface away from the die edge, according to some embodiments of the disclosure.

FIG. 1B, illustrates a plan view of the shingle die stack 100 of FIG. 1A, showing bond pads distributed on the upper die surface away from the die edge, according to some embodiments of the disclosure.

In FIG. 1B, multiple power terminal pads 105 are distributed over top surface 107 of die 101b. In some embodiments, power terminal pads 105 are distributed between bonding edge 111 and read edge 112. Wire bond pads 108 are located proximal to bonding edge 111. In some embodiments, relay pads 106 are adjacent to wire bond pads 108 and positioned between wire bond pads 108 and power terminal pads 105. The broken lines in FIG. 1B indicate connecting traces (109 in FIG. 1A) connecting relay pads 106 to wire bond pads 108. In some embodiments, the connecting traces are embedded under top surfaced 107. Die 101a is below die 101b in die stack 100. Die 101a and die 101b are separated by an intervening layer of DPDAF (102 in FIG. 1A), which not shown in FIG. 1B. In some embodiments, die stack 100 is disposed on package substrate 113, upon which bond finger 114 is disposed near bonding edge 111 of dies 101a and 101b. In some embodiments, package substrate 113 comprises Bakelite, epoxy, or build-up film. In some embodiments, power terminal pads 105 and relay pad 106 are identically configured on die 101a.

Power terminal pads 105 and relay pads 106, as well as wire bond pads 108 may comprise materials such as, but not limited to, copper, copper alloys, aluminum and alloys of aluminum, nickel, and polysilicon. In some embodiments, power terminal pads 105 may be a single pad disposed on top surface 107. In some embodiments, power terminal pads 105 may be a plurality of pads disposed on top surface 107, as shown in FIG. 1B. One or more relay pads 106 may be present, as indicated in FIG. 1B. In some embodiments, power terminal pads 105 are part of one or more integrated circuits incorporated on the dies (100a and 100b). As an example, power terminal pads 105 are coupled to a $V_{DD}$ power rail. In some embodiments, relay pads 106 are disposed near bonding edge 111. In some embodiments, relay pads 106 are electrically coupled to one or more wire bond pads 108.

Advantageously, conductive adhesive layer 104 of DPDAF 102 provides an external low resistance path coupling power terminal pads 105 to relay pads 106, eliminating the need for power traces coupling wire bond pads 108 and power terminal pads 105. The reduction or elimination of power traces may allow more choices for signal routing and increase signal trace routing density. In some embodiments, conductive adhesive layer 104 has a thickness ranging from 1 to 50 microns and a width extending up to the width of the die. Due to the relatively large cross-sectional dimensions of conductive adhesive layer 104, the sheet resistance may be significantly lower than that of traditional metal traces, allowing significantly larger currents to be distributed to power terminal pads 105. DLDAF 102 enables design of integrated circuits having one or more distributed power terminals. As a consequence, the requirement for long and potentially higher resistance power traces is reduced, allowing a higher density of power consuming devices, such as transistors and resistors, to be included in the integrated circuitry.

Figure 2A:
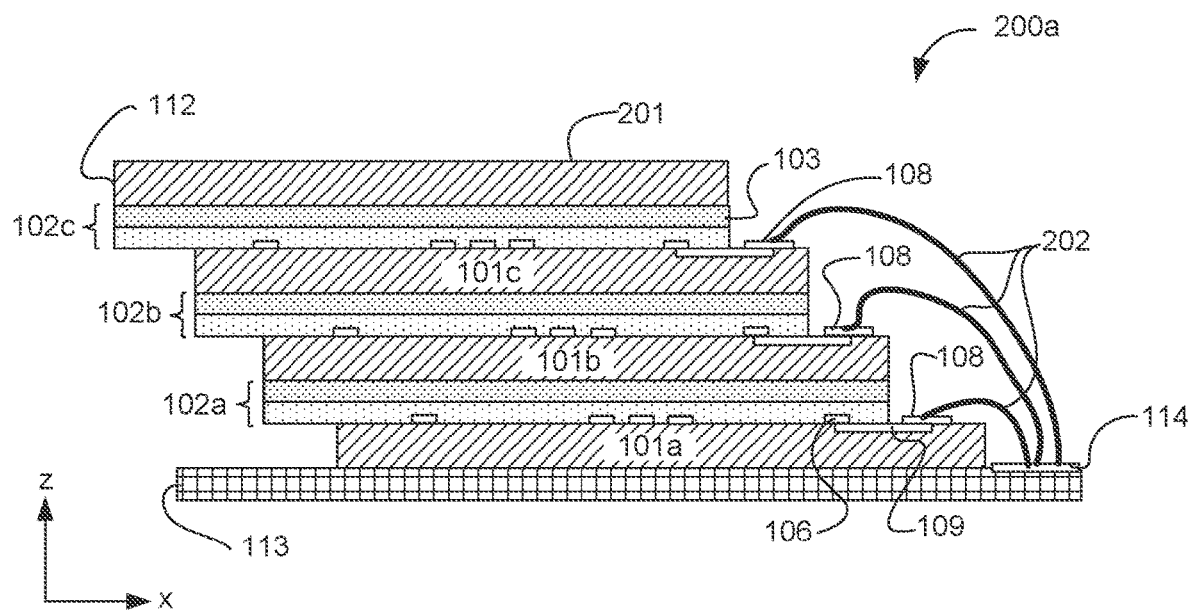
FIG. 2A illustrates a cross-sectional view of an exemplary shingle die stack assembly having a spacer die on top, with DLDAF layers between adjacent dies, according to some embodiments of the disclosure.

FIG. 2A illustrates a cross-sectional view of an exemplary shingle die stack assembly 200a having a spacer die on top, with double layer die attach film (DLDAF) layers between adjacent dies, according to some embodiments of the disclosure.

FIG. 2A illustrates one example of a complete die stack assembly 200 in shingle stacking configuration. In shingle stacking, edges 112 of dies 101a, 101b and 101c, including spacer die 201, are offset. Spacer die 201 caps die stack 200 comprising dies 101a, 101b and 101c, which are active dies according to some embodiments. In some embodiments, spacer die 201 is disposed above top active die 101c, and provides a cap for non-conductive adhesive layer 103 of the topmost DLDAF layer 102c. Wires 202 are bonded at a first end to wire bond pads 108 on dies 101a, 101b and 101c. Wires 202 are bonded at a second end to bond finger 114 disposed on package substrate 113. In some embodiments, wires 202 provide power connections from power distribution metallization coupled to bond finger 114 on package substrate 113.

In some embodiments, bond pads 108 are coupled to relay pad 106 through trace 109 as described above. In the illustrated embodiment of FIG. 2A, power is delivered from a power pin on package substrate 113 to relay pad 106 by wires 202. The shingle stack configuration of die stack 200a exposes bond pads 108 for access to wire bonds. In the illustrated embodiment shown in FIG. 2A, die stack 200a comprises three dies 101a, 101b, and 101c, however, the number of dies in die stack 200a is not limited, and any number of dies may be included in die stack 200a.

Figure 2B:
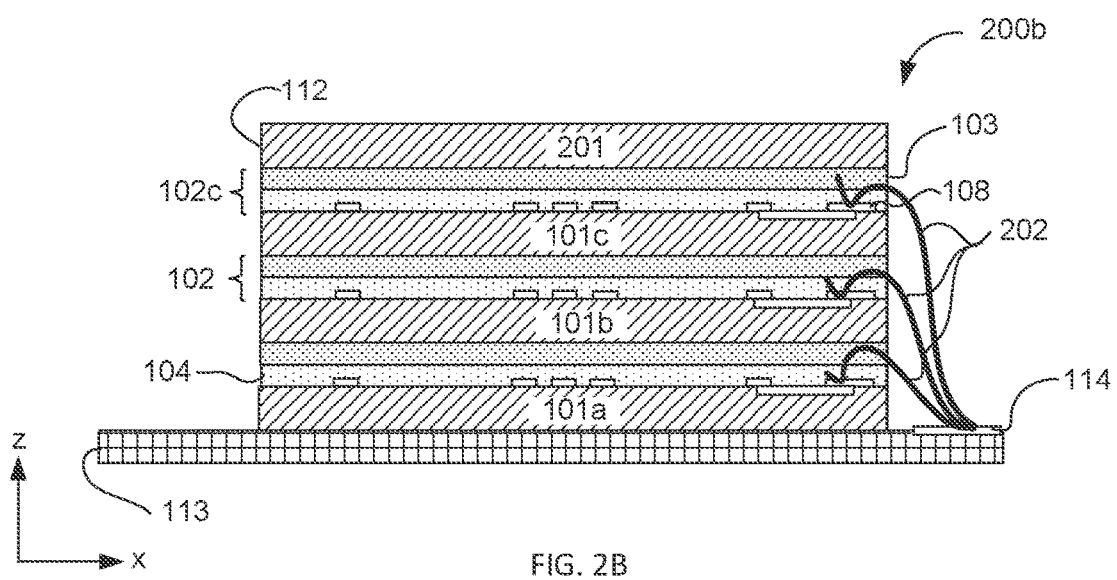
FIG. 2B illustrates a cross-sectional view of an exemplary straight up die stack assembly with DLDAF layers between adjacent dies, according to some embodiments of the disclosure.

FIG. 2B illustrate a cross-sectional view of an exemplary straight-up die stack 200b assembly with dual-sided die attach film layers between adjacent dies, according to some embodiments of the disclosure.

In FIG. 2B, an example of a straight-up stack 200b having dies 101a, 101b, 101c and spacer die 201 are arranged with edges 112 aligned. The straight-up die stack architecture decreases x-y package footprint, facilitating further miniaturization of computing and analog devices. Wires 202 are bonded to wire bond pads 108, which are embedded within conductive adhesive layer 104 of DLDAF 102. As with FIG. 2A, spacer die 201 is present in some embodiments to cap die stack 200b and cover non-conductive adhesive layer 103 of topmost DLDAF 102c.

In some embodiments, wires 202 are each bonded at a first send to bond pads 108, and at a second end, to bond finger 114 on package substrate 113. In other embodiments, wires 202 are bonded to wire bond pads 108 on adjacent or non-adjacent dies 101a-101c within die stack 200b.

Figure 3A:
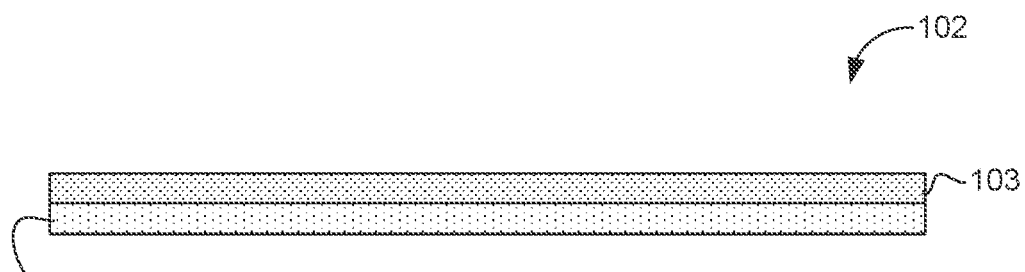
FIG. 3A illustrates a cross-sectional view of a portion of DLDAF, according to some embodiments of the disclosure.

FIG. 3A illustrates a cross-sectional view of a portion of double-layer die attach film 102, according to some embodiments of the disclosure.

In FIG. 3A, a portion of DLDAF 102 is shown. According to some embodiments, conductive adhesive layer 104 and non-conductive adhesive layer 103 are adjacent layers, and comprise a polymer matrix impregnated with adhesive compounds. In some embodiments, conductive adhesive layer 104 comprises conductive particulates of graphite, gold and silver. In some embodiments, DLDAF 102 comprises a partially cured thermoset polymer resin that is cured to a solid die attach layer after the die stack is assembled to permanently hold the die stack in a rigid configuration.

Figure 3B:
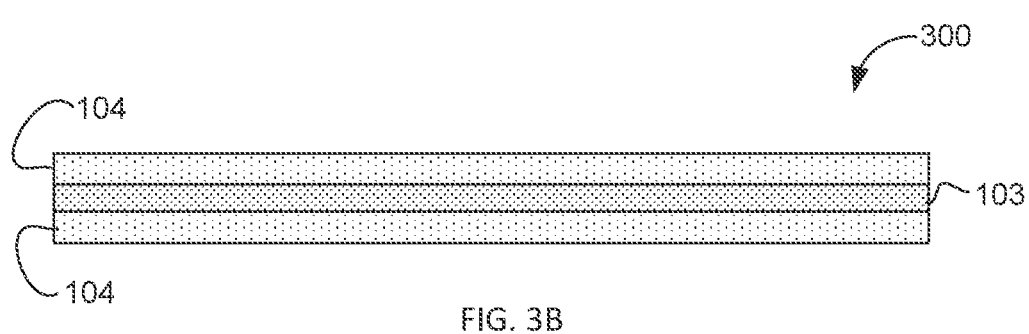
FIG. 3B illustrates a cross-sectional view of a portion of a triple-layer die attach film (TLDAF), according to some embodiments of the disclosure.

FIG. 3B illustrates a cross-sectional view of a portion of triple layer die attach film 300, according to some embodiments of the disclosure.

In FIG. 3B, triple layer die attach film 300 (TLDAF) 300 comprises a non-conductive layer 103 is sandwiched between two conductive adhesive layers 104. In some embodiments, conductive adhesive layers 104 are substantially identical, comprising conductive particulates, such as, but not limited to, graphite, gold and silver. Similar to DLDAF 102 in FIG. 3A, TLDAF 300 comprises a polymer matrix. In some embodiments, TLDAF 300 comprises a thermoplastic polymer resin that hardens upon heating. As will be shown below, TLDAF 300 may be employed for dies having power terminal pads on both top and bottom surfaces, where conductive adhesive layers may contact the active surfaces of upper and lower adjacent dies in the stack.

Figure 3C:
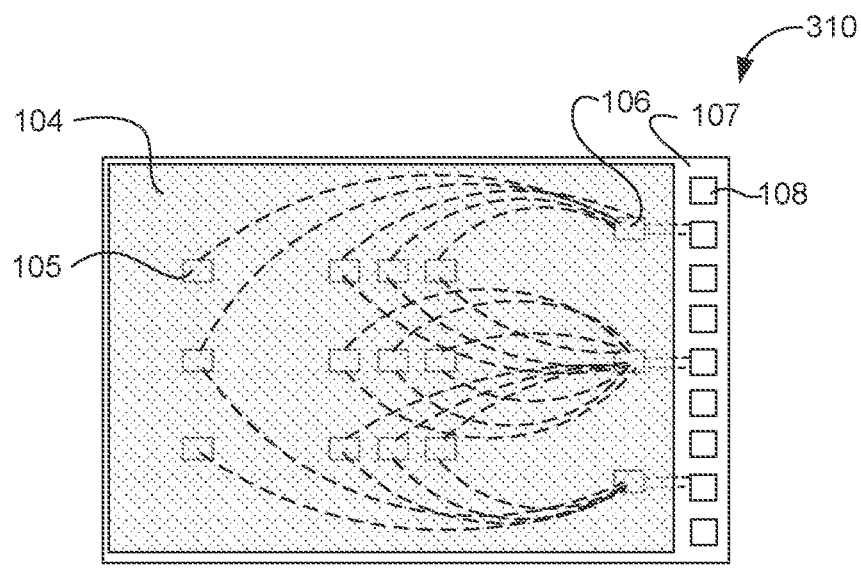
FIG. 3C illustrates a plan view of a die having power pads distributed over the top surface of the die, and covered by a section of DLDAF, according to some embodiments of the disclosure.

FIG. 3C illustrates a plan view of die 310 covered by a section of double layer die attach film (DLDAF) showing an exemplary current distribution through conductive adhesive layer 104, according to some embodiments of the disclosure.

In FIG. 3C, coverage of metallization comprising power pad terminals (e.g., 105 in FIG. 1B) and relay pads (e.g., 106 in FIG. 1B) by conductive adhesive layer 104 (of DLDAF 102 or TLDAF 300) is shown. In FIG. 3C, conductive adhesive layer 104 is partially transparent to show underlying power terminal pads 105 and relay pads 106 in a configuration similar to that shown in FIG. 1B. An example of current distribution from relay pads to power terminals as current is conducted through conductive adhesive layer 104. Dashed curves along top surface 107 of die 101 demonstrate an exemplary current distribution from relay pads 106 to power terminal pads 105. The current distribution shows that current may spread from a single relay pad 106 to multiple power terminal pads 105. In some embodiments, multiple relay pads 106 simultaneously deliver power to power terminal pads 105, allowing symmetric current distribution patterns to emerge through conductive adhesive layer 104, as shown in FIG. 3C. In this way, heat distribution may also be balanced over the die top surface 107, preventing hot spots on the die.

Figure 4:
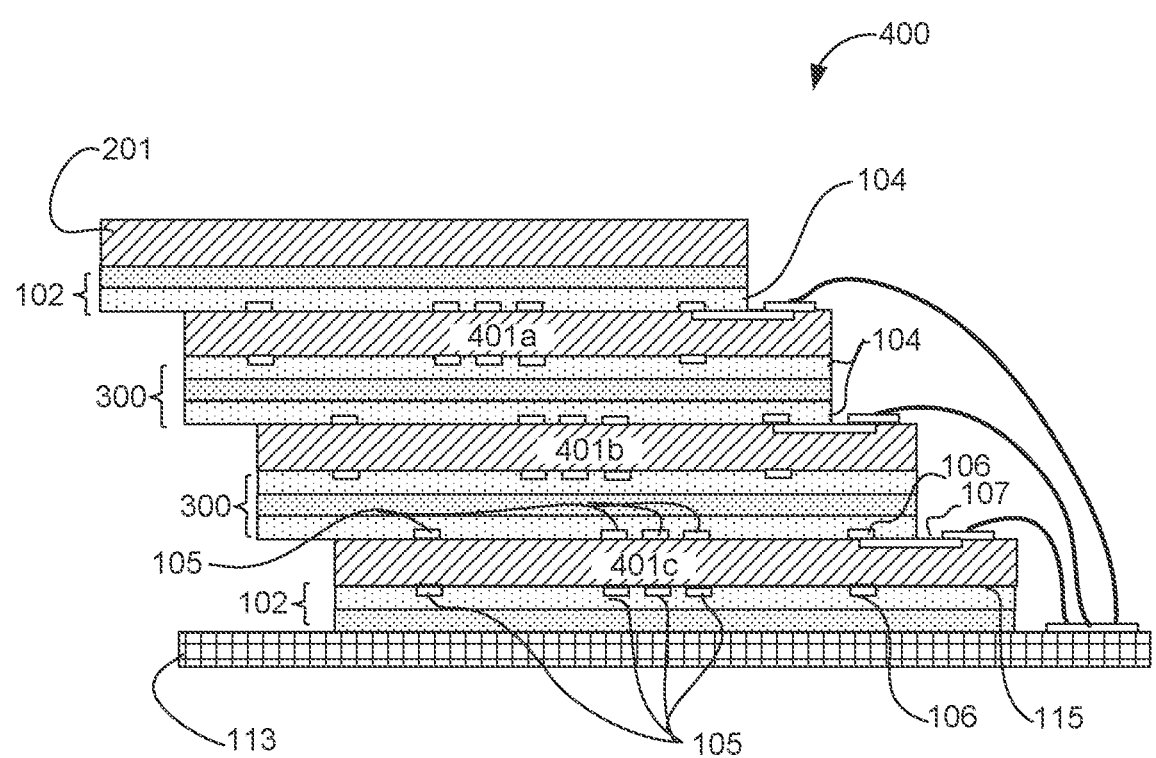
FIG. 4 illustrates a cross-sectional view of an exemplary shingle die stack with triple-layer die attach film (TLDAF) between adjacent dual-sided dies, according to some embodiments of the disclosure.

FIG. 4 illustrates a cross-sectional view of an exemplary shingle die stack 400 with triple layer die attach film between adjacent dual-sided dies, according to some embodiments of the disclosure.

In FIG. 4, die stack 400 comprises double-sided dies 401, having power terminal pads 105 and rely pads 106 disposed on both sides. In this implementation, triple layer die attach film (TLDAF) 300 is disposed between dies 401a, 401b and 401c, contacting power terminal pads 105 and relay pads 106 on both sides of dies 401. Die stack 400 is capped with spacer die 201. Beneath spacer die 201 is double layer die attach film (DLDAF) 102 between spacer die 201 to die 401a. Similarly, DLDAF 102 is inserted between die stack 400 and package substrate 113, where non-conductive layer 103 cements die stack 400 to package substrate 113, while coupling power terminal pads 105 and relay pads 106 on the bottom side of die 401c.

In some embodiments, all power terminal pads 105 disposed on a side of dies 401a-401c are coupled to each other through conductive adhesive layer 104, and therefore at the substantially the same potential. In some embodiments, portions of power terminal pads 105 are coupled through separate portions of double layer die attach film. As an example, in some embodiments, one portion of power terminal pads 105 are coupled to a positive voltage rail on substrate 113. Another portion of power terminal pads 105 are coupled to a ground rail on substrate 113. In some embodiments, power terminal pads 105 on top surface 107 are coupled to a positive or negative voltage rail on substrate 113, and power terminals 105 on bottom surface 110 of dies 401a, 401b, and 401c are coupled to a ground rail on substrate 113.

Figure 5:
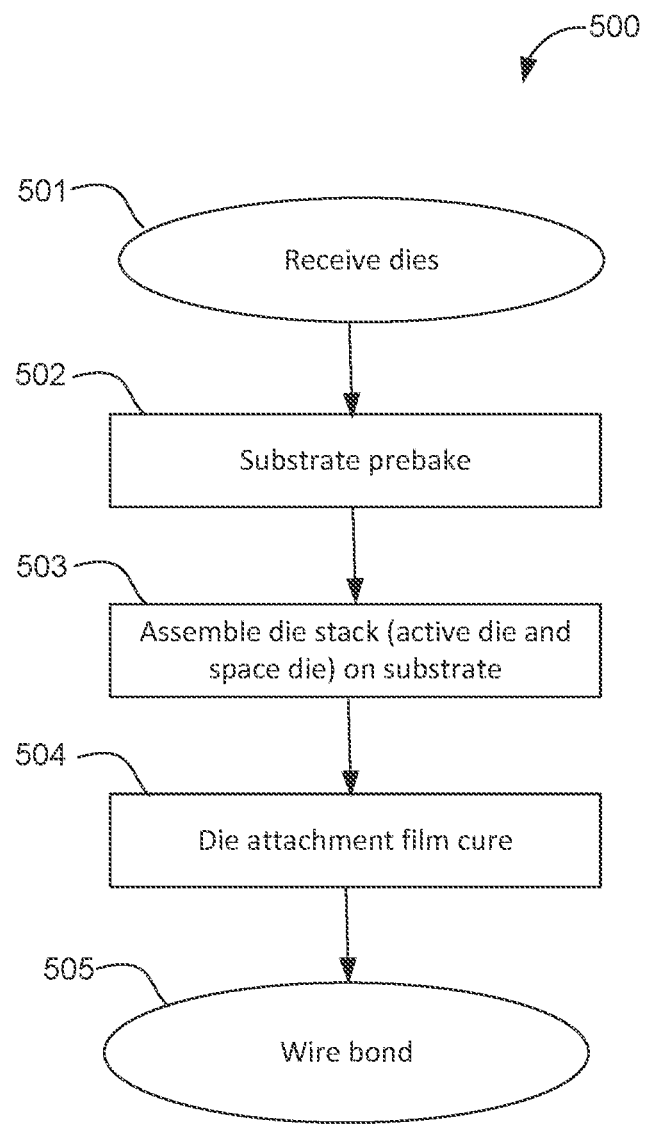
FIG. 5 illustrates a flow chart for a process flow for assembling a die stack with the DLDAF, according to some embodiments of the disclosure.

FIG. 5 illustrates a flow chart 500 describing a process flow for assembling a die stack with DLDAF, according to some embodiments of the disclosure.

In FIG. 5, several steps are shown for assembly of a die stack comprising DLDAF (102) or TLDAF (300). At operation 501, singulated dies are received and transferred to a front of line (FOL) package assembly. In some embodiments, the dies have power terminal pads and relay pads on one side. In other embodiments, the dies have power terminal pads and relay pads on both sides.

At operation 502, The die stack formation begins with substrate preparation. A substrate upon which the die stack is to be assembled undergoes a prebake step. In some embodiments, a buildup film is employed as the substrate. In other embodiments, an epoxy material is employed as a substrate. In some embodiments, the prebake step is to cure the substrate material.

At operation 503, the die stack is assembled. In some embodiments, the stack assembled in a shingle configuration. In some embodiments, the stack is assembled in a straight up configuration. Die attach is accomplished with DLDAF for single-sided dies, or TLDAF for double-sided dies. In some embodiments, the DLDAF or TLDAF is partially cured to remain malleable in order to maintain a degree of tackiness for adhesion to the surface of the dies. Die attachment may be facilitated by pick and place techniques. However, other die stack assembly methods may be employed to build the die stack. In some embodiments, the bottom-most die of the stack is a single sided die, and is attached to the substrate is using standard (non-conducting single layer) DAF. The bottom side of the single sided die is inactive, having no metallization. A conventional die attach film may be employed to anchor the first die to the substrate.

In some embodiments, the bottom-most die of the stack is a double-sided die. In some embodiments, the bottom die has metallization. In some embodiments, power terminal pads as well as relay pads are distributed on the bottom surface of the die. In some embodiments, a DLDAF attaches the die to the substrate, where the conductive adhesive layer of the DLDAF is attached to the bottom side of the die. The non-conductive adhesive layer of the DLDAF is attached to the substrate.

Returning to operation 503, dies are added to the stack in alternating succession of die attach film as DLDAF or TLDAF to the topmost die, then placement of a die onto the die attach film. In some embodiments, a DLDAF or TLDAF layer is attached to the top surface of the bottom-most die of the stack. The choice of DLDAF or TLDAF depends on the stack architecture. In some embodiments, the die stack is comprised entirely of single-sided dies. In some embodiments, the die stack is comprised entirely of double-sided dies. In some embodiments, the die stack is comprised of some single sided dies and some double-sided dies.

Placement of a single sided die on the growing die stack presents its bottom side, which is an inactive surface with no metallization, above the metallized surface of a single-sided or double-sided lower adjacent die. In some embodiments, the bottom side of the single-sided die comprises semiconductor material and is conductive. In some embodiments, the die stack is assembled by first placing a layer of DLDAF with the conductive adhesive layer face down over the top-most die of the die stack, followed by placement of a single-sided die on the non-conductive adhesive layer of the DLDAF layer.

Placement of a double-sided die on the growing die stack presents its bottom side, which is a metallized die surface, over the metallized die surface from the lower adjacent die in a vertical stack. In some embodiments, the die stack is assembled by first placing a layer of TLDAF layer on the top-most die, followed by placement of a double-sided die on the growing stack.

At the termination of the assembly process, a spacer die is placed over the top-most active die in the die stack, according to some embodiments. In some embodiments, a layer of DLDAF with the conductive adhesive layer bottom-side is placed over the top surface of the top-most die in the die stack. The conductive adhesive layer covers and adheres to the top surface metallization (e.g., power terminal pads and relay pads). The non-conductive adhesive layer adheres to the spacer die above. The die stack is assembled at this point.

Referring now to operation 504 of FIG. 5, the die attachment film (e.g., DLDAF and/or TLDAF) is cured at high temperature for a final cure. In some embodiments, the cure step is carried out at 60° C.-70° C. In other embodiments, the cure step is carried out at 75° C.-80° C. (time). During curing, the die attachment film hardens to form a rigid layer, cementing dies in the die stack into the particular configuration (shingle or straight up).

At operation 505, wire bonding is performed, where wires are bonded to wire bond pads (e.g., 108 in FIG. 1A) on the bonding edges of dies in the die stack and the bond finger disposed on the package substrate. In some embodiments, the die stack configuration is a shingle configuration, and wire bonding is performed after operation 504, curing the die attachment film. In some embodiments, the die stack configuration is a straight up configuration. In some embodiments, wire bonding is performed after attachment of each die on a growing straight up die stack. Wire bonding may be performed by standard wire bonding methods.

FIGS. 6A-6F illustrate cross-sectional views of an exemplary method for assembling a shingle die stack 200a, according to some embodiments.

Figure 6A:
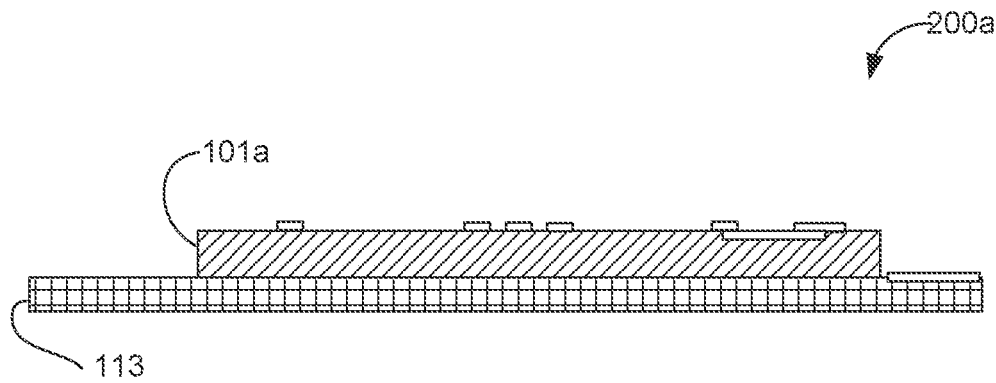
FIGS. 6A-6F illustrate cross-sectional views of an exemplary method of assembling shingle die stack, according to some embodiments.

In FIG. 6A, the assembly of die stack 200a begins with die 101a attached to substrate 113. In some embodiments, die 101a is a single sided die, as illustrated. In some embodiments, substrate 113 is prepared in operation 502 of process flow 500 (FIG. 5). Die 101a is attached to substrate 113 by any number of suitable methods. In some embodiments, die 101 is attached with die attach film. In some embodiments, the die attach film is standard single layer insulating adhesive film. In some embodiments, die 101a is a double-sided die, attached to substrate 113 by a layer of DLDAF.

Figure 6B:
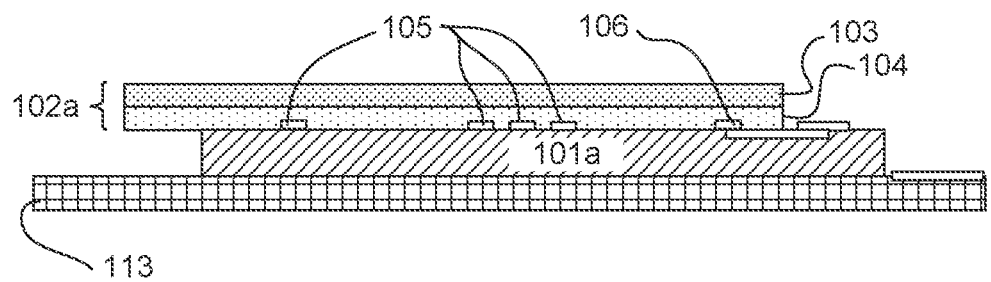
Figure 6C:
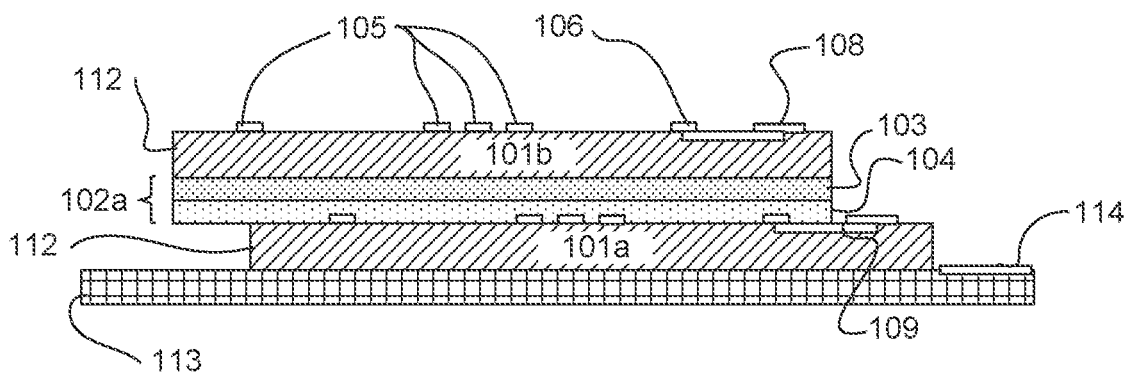

In FIG. 6B, a first layer of DLDAF 102a is attached to die 101a with non-conductive layer 103 facing upward. As the stack configuration is shingle, DLDAF 102a is offset in the x-dimension relative to die 101a. Conductive adhesive layer 104 covers power terminal pads 105 and relay pad 106. In FIG. 6C, second die 101b is attached to DLDAF 102a. Attachment may be accomplished by pick and place techniques. Die 101b is attached to non-conductive adhesive layer 103 with edges aligned, according to some embodiments. In some embodiments, die stack 200a is assembled as a straight-up die stack, such as shown in FIG. 2B, where edges 112 are aligned.

Figure 6D:
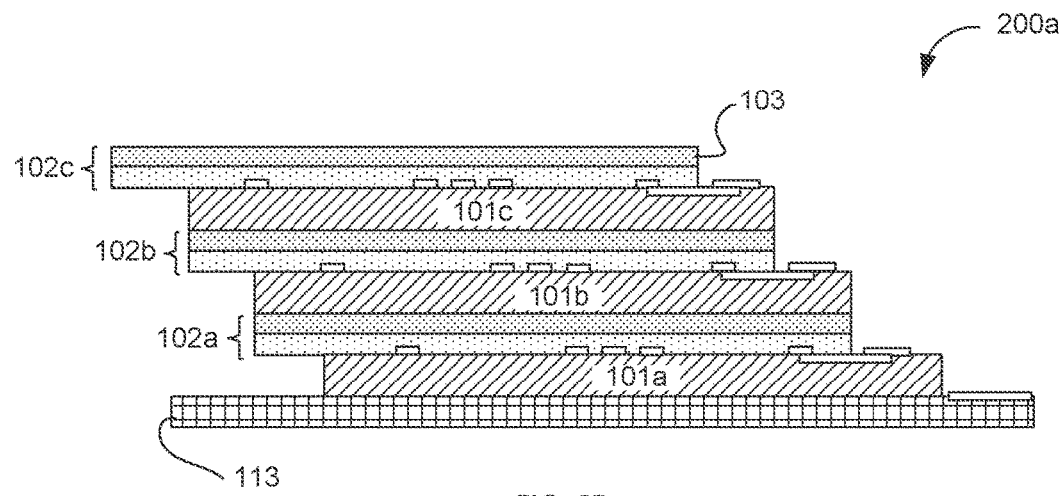
Figure 6E:
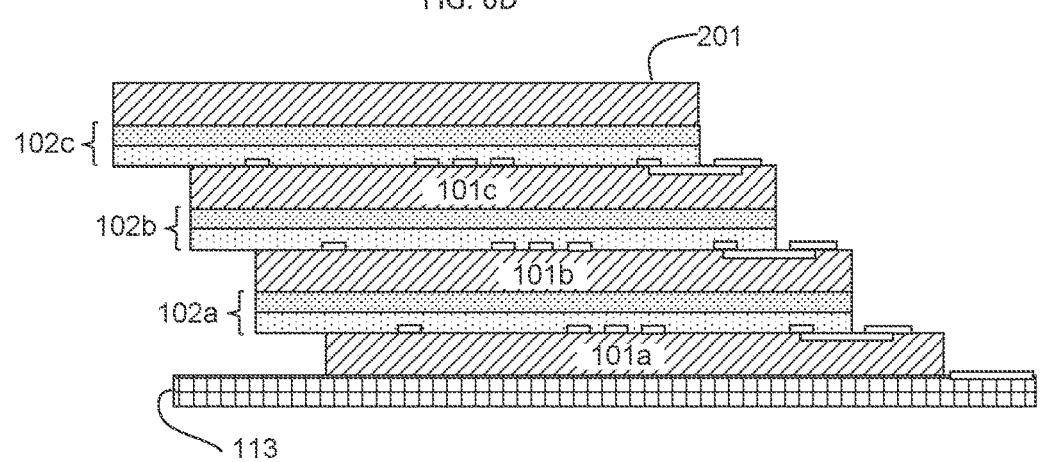

In FIG. 6D, the operations illustrated in FIG. 6B and FIG. 6C have been repeated two more times each to arrive at the structure shown. In some embodiments, dies 101b and 101c have been added in alternating succession with DPDAF layers 102b and 102c, with an offset in the x-dimension. Non-conductive adhesive layer 103 of DPDAF layer 102c is exposed. In FIG. 6E, spacer die 201 is attached over DPDAF 102c to cap die stack 200a, according to some embodiments.

Spacer die 201 is attached to non-conductive adhesive layer 103 of DPDAF layer 102c. In some embodiments, spacer die 201 is omitted. In some embodiments, a curing operation (not shown) may be performed after die stack assembly to solidify the DLDAF, resulting in a rigid die stack.

Figure 6F:
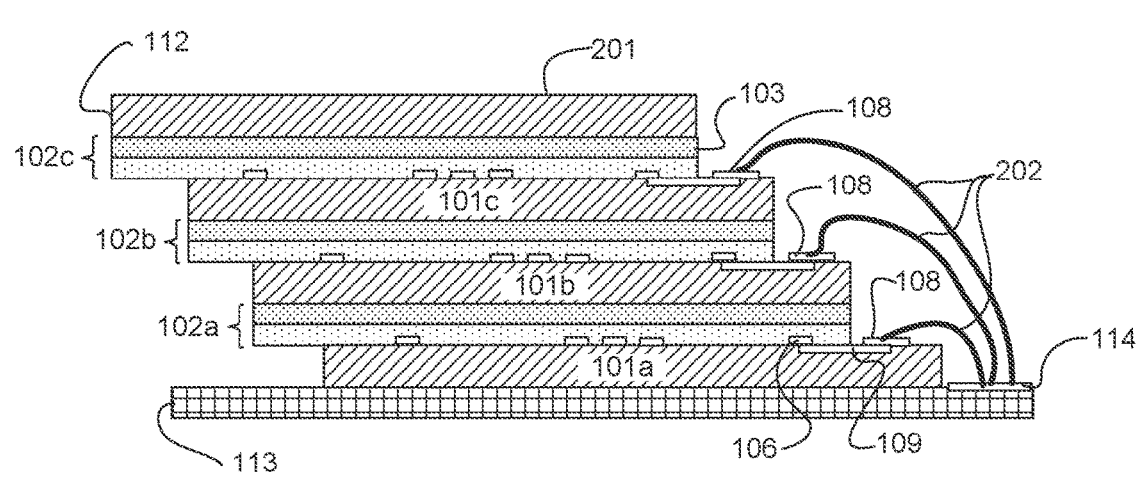

In FIG. 6F, wires 202 are bonded to bond pads 108 after die stack 200a is assembled. Wire bonding may be performed after a curing step by any number of techniques. In some embodiments, wires are ball bonded to the die bond pads (108) and stitch-bonded to the bond finger (114) on substrate 113. In some embodiments, wires are bonded to each die during building of die stack 200a.

Figure 7:
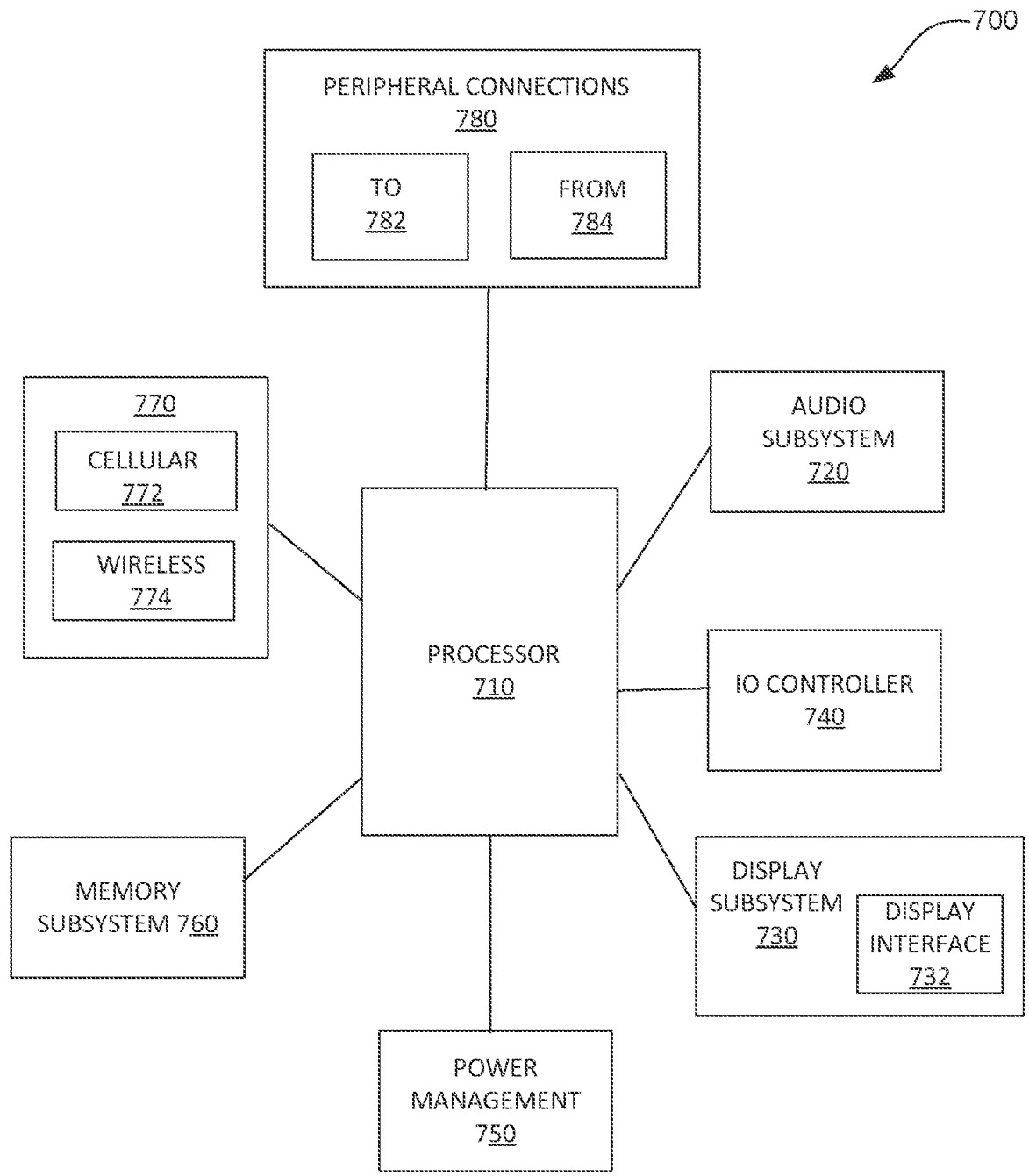
FIG. 7 illustrates a package with a Stacked Chip Scale Package (SCSP) comprising a DLDAF or a TLDAF in a vertical die stack, connecting multiple dies as part of a system-on-chip (SoC) package in an implementation of a computing device, according to some embodiments of the disclosure.

FIG. 7 illustrates a package with a SCSP package comprising a DLDAF or a TLDAF in a vertical die stack, connecting multiple dies as part of a system-on-chip (SoC) package in an implementation of computing device 700, according to some embodiments of the disclosure.

FIG. 7 illustrates a block diagram of an embodiment of a mobile device in which flat surface interface connectors could be used. In some embodiments, computing device 700 represents a mobile computing device, such as a computing tablet, a mobile phone or smart-phone, a wireless-enabled e-reader, or other wireless mobile device. It will be understood that certain components are shown generally, and not all components of such a device are shown in computing device 700.

In some embodiments, computing device 700 includes a first processor 710. The various embodiments of the present disclosure may also comprise a network interface within 770 such as a wireless interface so that a system embodiment may be incorporated into a wireless device, for example, cell phone or personal digital assistant.

In one embodiment, processor 710 can include one or more physical devices, such as microprocessors, application processors, microcontrollers, programmable logic devices, or other processing means. The processing operations performed by processor 710 include the execution of an operating platform or operating system on which applications and/or device functions are executed. The processing operations include operations related to I/O (input/output) with a human user or with other devices, operations related to power management, and/or operations related to connecting the computing device 700 to another device. The processing operations may also include operations related to audio I/O and/or display I/O.

In one embodiment, computing device 700 includes audio subsystem 720, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 700, or connected to the computing device 700. In one embodiment, a user interacts with the computing device 700 by providing audio commands that are received and processed by processor 710.

Display subsystem 730 represents hardware (e.g., display devices) and software (e.g., drivers) components that provide a visual and/or tactile display for a user to interact with the computing device 700. Display subsystem 730 includes display interface 732 which includes the particular screen or hardware device used to provide a display to a user. In one embodiment, display interface 732 includes logic separate from processor 710 to perform at least some processing related to the display. In one embodiment, display subsystem 730 includes a touch screen (or touch pad) device that provides both output and input to a user.

I/O controller 740 represents hardware devices and software components related to interaction with a user. I/O controller 740 is operable to manage hardware that is part of audio subsystem 720 and/or display subsystem 730. Additionally, I/O controller 740 illustrates a connection point for additional devices that connect to computing device 700 through which a user might interact with the system. For example, devices that can be attached to the computing device 700 might include microphone devices, speaker or stereo systems, video systems or other display devices, keyboard or keypad devices, or other I/O devices for use with specific applications such as card readers or other devices.

As mentioned above, I/O controller 740 can interact with audio subsystem 720 and/or display subsystem 730. For example, input through a microphone or other audio device can provide input or commands for one or more applications or functions of the computing device 700. Additionally, audio output can be provided instead of, or in addition to display output. In another example, if display subsystem 730 includes a touch screen, the display device also acts as an input device, which can be at least partially managed by I/O controller 740. There can also be additional buttons or switches on the computing device 700 to provide I/O functions managed by I/O controller 740.

In one embodiment, I/O controller 740 manages devices such as accelerometers, cameras, light sensors or other environmental sensors, or other hardware that can be included in the computing device 700. The input can be part of direct user interaction, as well as providing environmental input to the system to influence its operations (such as filtering for noise, adjusting displays for brightness detection, applying a flash for a camera, or other features).

In one embodiment, computing device 700 includes power management 750 that manages battery power usage, charging of the battery, and features related to power saving operation. Memory subsystem 760 includes memory devices for storing information in computing device 700. Memory can include nonvolatile (state does not change if power to the memory device is interrupted) and/or volatile (state is indeterminate if power to the memory device is interrupted) memory devices. Memory subsystem 760 can store application data, user data, music, photos, documents, or other data, as well as system data (whether long-term or temporary) related to the execution of the applications and functions of the computing device 700.

Elements of embodiments are also provided as a machine-readable medium (e.g., memory 760) for storing the computer-executable instructions. The machine-readable medium (e.g., memory 760) may include, but is not limited to, flash memory, optical disks. CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity via network interface 770 includes hardware devices (e.g., wireless and/or wired connectors and communication hardware) and software components (e.g., drivers, protocol stacks) to enable the computing device 700 to communicate with external devices. The computing device 700 could be separate devices, such as other computing devices, wireless access points or base stations, as well as peripherals such as headsets, printers, or other devices.

Network interface 770 can include multiple different types of connectivity. To generalize, the computing device 700 is illustrated with cellular connectivity 772 and wireless connectivity 774. Cellular connectivity 772 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 774 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 780 include hardware interfaces and connectors, as well as software components (e.g., drivers, protocol stacks) to make peripheral connections. It will be understood that the computing device 700 could both be a peripheral device ("to" 782) to other computing devices, as well as have peripheral devices ("from" 784) connected to it. The computing device 700 commonly has a "docking" connector to connect to other computing devices for purposes such as managing (e.g., downloading and/or uploading, changing, synchronizing) content on computing device 700. Additionally, a docking connector can allow computing device 700 to connect to certain peripherals that allow the computing device 700 to control content output, for example, to audiovisual or other systems.

In addition to a proprietary docking connector or other proprietary connection hardware, the computing device 700 can make peripheral connections 780 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

Example 1 is an apparatus, comprising a die stack comprising at least one die pair, the at least one die pair having a first die over a second die, the first die and the second die both having a first surface and a second surface, the second surface of the first die over the first surface of the second die, and an adhesive film between the first die and the second die of the at least one die pair; wherein the adhesive film comprises an insulating layer and a conductive layer, the insulating layer adhering to the second surface of the first die and the conductive layer adhering to the first surface of the second die.

Example 2 includes all of the features of example 1, wherein one or more electrical contact pads are on the first surface of the first die and the first surface of the second die, and wherein at least a portion of the one or more electrical contact pads are electrically coupled by the conductive layer of the adhesive film.

Example 3 includes all of the features of example 2, wherein the one or more contact pads on the first surface of the first die and the first surface of the second die comprise at least one power terminal and at least one edge bond pad.

Example 4 includes all of the features of example 3, wherein the distance between the at least one power terminal and the at least one edge bond pad of the first die ranges between one third of the length of the first die and the length of the first die.

Example 5 includes all of the features of example 3, wherein the distance between the at least one power terminal and the at least one edge bond pad of the second die ranges between one third of the length of the second die and the length of the second die.

Example 6 includes all of the features of example 3, wherein the one or more contact pads on the first surface of the first die and the first surface of the second die comprise at least one relay contact coupled to the at least one edge bond pad on the by a metal interconnect, and the at least one power terminal is coupled to the at least one relay contact by the conductive adhesive layer.

Example 7 includes all of the features of example 1, wherein the adhesive film comprises an insulating layer between a first conductive adhesive layer and a second conductive adhesive layer.

Example 8 includes all of the features of example 7, wherein the first conductive adhesive layer adheres to the second surface of the first die, and the second conductive adhesive layer adheres to the first surface of the second die.

Example 9 includes all of the features of example 8, wherein one or more contact pads are on the second surface of the first die and on the first surface of the second die, and wherein at least a portion of the one or more contact pads on the second surface of the first die are electrically coupled by the first conductive adhesive layer, and at least a portion of the one or more contact pads on the first surface of the second die are electrically coupled by the second conductive adhesive layer.

Example 10 includes all of the features of example 9, wherein the one or more contact pads on the second surface of the first die comprise at least one power terminal.

Example 11 includes all of the features of example 9, wherein the one or more contact pads on the first surface of the second die comprise at least one power terminal.

Example 12 includes all of the features examples 10 or 11, wherein the one or more contact pads comprise at least one relay contact coupled to an edge bond pad on the by a metal interconnect, and the at least one power terminal is coupled to the at least one relay contact by the conductive adhesive layer.

Example 13 includes all of the features of examples 10 or 11, wherein the distance between the at least one power terminal and the bond edge of the first die ranges between one third of the length of the first die and the length of the first die.

Example 14 includes all of the features of examples 10 or 11, wherein the distance between the at least one power terminal and the bond edge of the second die ranges between one third of the length of the second die and the length of the second die.

Example 15 includes all of the features of example 1 wherein the adhesive film is a laminate comprising an insulating layer and at least one conductive layer.

Example 16 includes all of the features of any of examples 1 through 15, wherein one or more edges of the first die and the second die are laterally offset.

Example 17 includes all of the features of any of examples 1 through 15, wherein the edges of the first die and the second die are aligned.

Example 18 includes all of the features of any of examples 1 through 15, wherein the die stack comprises a spacer die over the first die of the at least one die pair.

Example 19 is a system, comprising a memory, a processor coupled to the memory, and an apparatus comprising at least one die pair having a first die over a second die, the first die and the second die both having a first surface and a second surface, the second surface of the first die over the first surface of the second die, and an adhesive film between the first die and the second die of the at least one die pair, wherein the adhesive film comprises an insulating layer adhering to the second surface of the first die and the conductive layer adhering to the first surface of the second die.

Example 20 includes all of the features of example 19, wherein one or more electrical contact pads are on the first surface of the first die and the first surface of the second die, and wherein at least a portion of the one or more electrical contact pads are electrically coupled by the conductive layer of the adhesive film.

Example 21 includes all of the features of example 20, wherein the one or more contact pads on the first surface of the first die and the first surface of the second die comprise at least one power terminal and at least one edge bond pad.

Example 22 includes all of the features of example 21, wherein the distance between the at least one power terminal and the bond pad edge of the first die ranges between one third of the length of the first die and the length of the first die.

Example 23 includes all of the features of example 21, wherein the distance between the at least one power terminal and the bond pad edge of the second di range between one third of the length of the second die and the length of the second die.

Example 24 includes all of the features of examples of any one of 20 through 23, wherein the one or more contact pads on the first surface of the first die and the first surface of the second die comprise at least one relay contact coupled to the at least one edge bond pad by an interconnect, and the at least one power terminal is coupled to the at least one relay contact by the conductive adhesive layer.

Example 25 is a method comprising receiving a first die having a first surface and a second surface, attaching a first adhesive film having an insulating layer and a conductive layer to the first die, wherein the conductive layer is attached to the first surface of the first die, receiving a second die having a first surface and a second surface, attaching a second adhesive film having an insulating layer and a conductive layer to the second die, wherein the conductive layer is attached to the first surface of the second die, and attaching the second surface of the second die to the insulating layer of the first adhesive film attached to the first die.

Example 26 includes all of the features of example 25, further comprising receiving a spacer die having a first surface and a second surface, attaching the spacer die to the insulating layer of the second adhesive film, and curing the first adhesive film and the second adhesive film.

Example 27 includes all of the features of examples 25 or 26, wherein receiving a first die comprises receiving a first die attached to a substrate.

Example 28 includes all of the features of example 25, wherein receiving a first die having a first surface and a second surface comprises receiving a first die having one or more power terminals disposed on the first surface.

Example 29 includes all of the features of example 28, wherein attaching a first film having an insulating layer and a conductive layer to the first die comprises adhering the conductive layer of the first adhesive film to the one or more power terminals disposed on the first surface of the first die.

Example 30 includes all the features of example 25, wherein receiving a second die having a first surface and a second surface comprises receiving a second die having one or more power terminals disposed on the first surface.

Example 31 includes all of the features of example 30, wherein attaching a second adhesive film having an insulting layer of the second adhesive film to the one or more power terminals disposed on the first surface of the second die.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus, comprising:
    an integrated circuit (IC) die stack comprising at least a first die under a second die; and
    a multi-layered film between the first die and the second die, wherein the film comprises an electrically conductive adhesive layer in contact with a first surface of the first die and an electrically insulative layer adhered to a second surface of the second die.

2. The apparatus of claim 1, wherein one or more first electrical contact pads on the first surface of the first die are in contact with the electrically conductive adhesive layer.

3. The apparatus of claim 2, wherein the first electrical contact pads comprise at least one power terminal electrically coupled to at least one edge bond pad through the electrically conductive adhesive layer.

4. The apparatus of claim 3, wherein the power terminal and the edge bond pad are separated by a first distance of at least one third of a length of the first die.

5. The apparatus of claim 3, wherein the first electrical contact pads comprise at least one relay contact coupled to the at least one edge bond pad through a metal interconnect trace within the first die, and wherein the relay contact is in direct contact with the electrically conductive adhesive layer.

6. The apparatus of claim 3, wherein the electrically conductive adhesive layer is a first electrically conductive adhesive layer, and the electrically insulative layer is between the first conductive adhesive layer and a second electrically conductive adhesive layer.

7. The apparatus of claim 6, wherein the first electrically conductive adhesive layer adheres to the first surface of the first die, and the second electrically conductive adhesive layer adheres to the second surface of the second die.

8. The apparatus of claim 7, wherein one or more second electrical contact pads on the second surface of the second die are electrically coupled together through the second electrically conductive adhesive layer.

9. The apparatus of claim 8, wherein:
    the second electrical contact pads comprise at least one second power terminal.

10. The apparatus of claim 9, wherein the second electrical contact pads comprise at least one second relay contact coupled to a second edge bond pad by a second metal interconnect trace within the second die, and the wherein the second relay contact is in direct contact with the second electrically conductive adhesive layer.

11. The apparatus of claim 10, wherein:
    a distance between the power terminal and the edge bond pad is at least one third of the length of the first die; and
    a distance between the second power terminal and the second edge bond pad is at least one third of the length of the second die.

12. The apparatus of claim 10, wherein one or more edges of the first die and the second die are laterally offset, and wherein the apparatus further comprises a first wire bonded to the first edge bond pad, and a second wire bonded to the second edge bond pad.

13. The apparatus of claim 10, wherein one or more edges of the first die and the second die are laterally aligned, and wherein the apparatus further comprises a first wire bonded to the first edge bond pad, and a second wire bonded to the second edge bond pad.

14. The apparatus of claim 1, wherein the die stack further comprises a spacer die over the second die.

15. A system comprising:
    a die stack comprising a processor die over a memory die;
    a multi-layered film adhering the processor die to the memory die, wherein the film comprises two adhesive materials, an electrically conductive one of the adhesive materials in contact with a first surface of the memory die and an electrically insulative one of the adhesive materials in contact with a second surface of the processor die; and a power supply coupled to the processor die.

16. The system of claim 15, wherein one or more electrical contact pads are on the first surface of the memory die, and wherein at least a portion of the one or more electrical contact pads are electrically coupled together by the conductive adhesive layer.

17. A method, comprising:

attaching an electrically conductive adhesive material layer of a multi-layered film to a first die; and attaching a second die to an electrically insulative adhesive material layer of the film, wherein two or more contact pads on a first surface of the first die are electrically coupled together through the electrically conductive adhesive material layer.

18. The method of claim 17, wherein attaching the electrically conductive adhesive material layer comprises adhering the electrically conductive adhesive layer to the two or more power terminals, and wherein attaching the second die to the electrically insulative adhesive material layer comprises adhering the electrically insulative adhesive layer to a surface of the second die.

19. The method of claim 18, further comprising attaching a second electrically conductive adhesive layer of a second film to second power terminals of the second die, the second electrically conductive adhesive layer of the second film electrically coupling together the second power terminals.

20. The method of claim 19, further comprising bonding a wire to an edge bond pad of the first die, the edge bond pad interconnected to only one of the power terminals through an interconnect trace on the first die.

* * * * *